United States Patent
Lee et al.

(10) Patent No.: US 7,951,652 B2
(45) Date of Patent: May 31, 2011

(54) MASK LAYOUT METHOD, AND SEMICONDUCTOR DEVICE AND METHOD FOR FABRICATING THE SAME

(75) Inventors: Sang Hee Lee, Eumseong-gun (KR); Gab Hwan Cho, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 447 days.

(21) Appl. No.: 12/115,861

(22) Filed: May 6, 2008

(65) Prior Publication Data

US 2008/0277804 A1    Nov. 13, 2008

(30) Foreign Application Priority Data

May 10, 2007    (KR) .................. 10-2007-0045622

(51) Int. Cl.
*H01L 21/00*    (2006.01)
(52) U.S. Cl. ........................................ 438/129; 257/786
(58) Field of Classification Search ................. 257/786; 438/129
See application file for complete search history.

(56) References Cited

U.S. PATENT DOCUMENTS

| | | | |
|---|---|---|---|
| 6,022,644 A * | 2/2000 | Lin et al. | 430/5 |
| 6,384,464 B1 * | 5/2002 | Shin | 257/503 |
| 7,763,398 B2 * | 7/2010 | Lee et al. | 430/5 |
| 2003/0204832 A1 | 10/2003 | Matumoto | |
| 2005/0139905 A1* | 6/2005 | Jung | 257/326 |
| 2007/0063223 A1* | 3/2007 | Choi | 257/202 |

FOREIGN PATENT DOCUMENTS

| | | |
|---|---|---|
| DE | 10154176 A1 | 5/2003 |
| JP | 2003-031578 A | 1/2003 |
| JP | 2003-031677 A | 1/2003 |
| JP | 2004-254725 | 3/2006 |

* cited by examiner

*Primary Examiner* — Jarrett J Stark
*Assistant Examiner* — Nicholas Tobergte
(74) *Attorney, Agent, or Firm* — Saliwanchik, Lloyd & Eisenschenk

(57) ABSTRACT

Provided are a mask layout method and a semiconductor device and a method for fabricating the same. The semiconductor device can include a main pattern, a first dummy pattern, and a second dummy pattern. The main pattern can be disposed on a substrate. The first dummy pattern and the second dummy pattern can be disposed around a side of the main pattern. The first dummy pattern can have an inner open region. The second dummy pattern can be disposed on the inner open region of the first dummy pattern, such that the first dummy pattern surrounds the second dummy pattern.

8 Claims, 4 Drawing Sheets

MASK LAYOUT METHOD, AND SEMICONDUCTOR DEVICE AND METHOD FOR FABRICATING THE SAME

CROSS-REFERENCE TO RELATED APPLICATION

The present application claims the benefit under 35 U.S.C. §119 of Korean Patent Application No. 10-2007-0045622, filed May 10, 2007, which is hereby incorporated by reference in its entirety.

BACKGROUND

A semiconductor device generally includes a multilayer structure. Each of the layers constituting the multilayer structure are generally formed using a deposition process or a sputtering process, and then patterned using a lithography process.

Since there are some limitations in the semiconductor device due to a difference in pattern size and pattern density of the layers of the semiconductor device on the substrate, methods where a main pattern and a dummy pattern are formed together are being developed.

BRIEF SUMMARY

Embodiments of the present invention provide a mask layout method, and a semiconductor device and a method for fabricating the same utilizing the mask formed through the mask layout method. According to an embodiment, a dummy pattern is provided having a new shape.

According to embodiments of the subject mask layout method, uniform patterns can be produced.

A mask layout method according to an embodiment of the present invention is capable of improving pattern density.

A mask layout method according to an embodiment of the present invention is capable of simplifying design and fabrication processes.

In one embodiment, a semiconductor device includes: main pattern on a substrate; a first dummy pattern at a side of the main pattern, the first dummy pattern having an open inner region; and a second dummy pattern on the open inner region of the first dummy pattern.

In another embodiment, a method for fabricating a semiconductor device includes: forming a main pattern on a substrate; forming a first dummy pattern including an open space region therein at a side of the main pattern; and forming a second dummy pattern such that the second dummy pattern is disposed on the open space region of first dummy pattern.

In further another embodiment, a mask layout method includes: forming a first dummy pattern including an open space therein; and forming a second dummy pattern on the open space of the first dummy pattern.

The details of one or more embodiments are set forth in the accompanying drawings and the description below. Other features will be apparent from the description and drawings, and from the claims.

DETAILED DESCRIPTION

Hereinafter, a mask layout method, and a semiconductor device and a method for fabricating the same will be described in detail with reference to the accompanying drawings.

In the following description, it will be understood that when a layer (or film) is referred to as being 'on' another layer or substrate, it can be directly on the other layer or substrate, or intervening layers may also be present. Further, it will be understood that when a layer is referred to as being 'under' another layer, it can be directly under the other layer, or one or more intervening layers may also be present. In addition, it will also be understood that when a layer is referred to as being 'between' two layers, it can be the only layer between the two layers, or one or more intervening layers may also be present.

Figure 1:
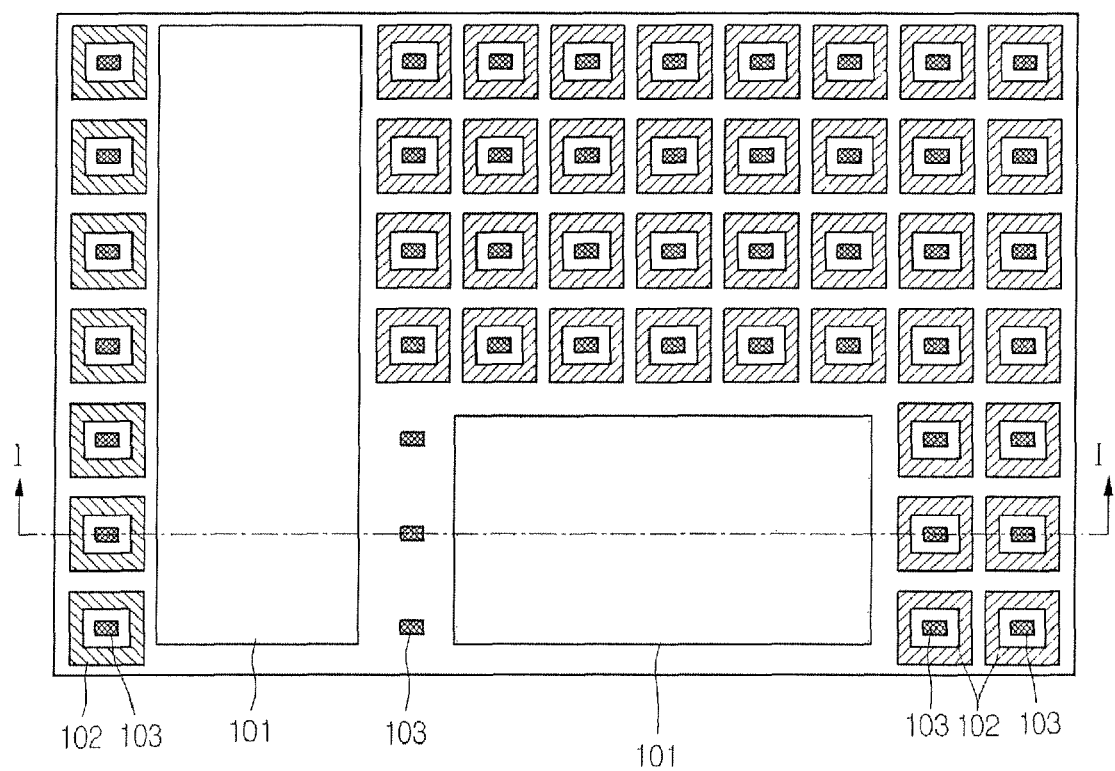
FIG. 1 is a plan view of a semiconductor device according to an embodiment.
Figure 2:
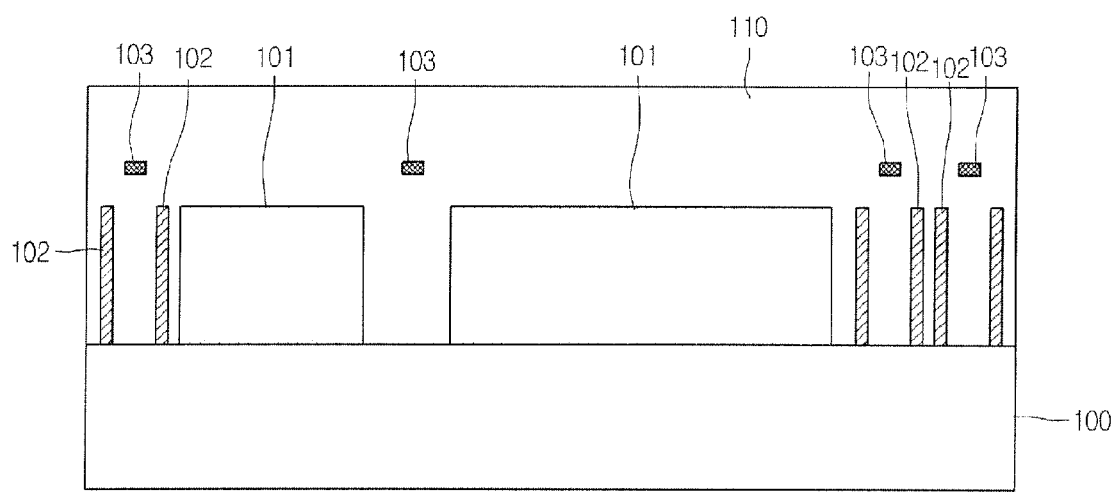
FIG. 2 is a cross-sectional view taken along line I-I' of FIG. 1.

Referring to FIGS. 1 and 2, a semiconductor device according to one embodiment can include main patterns 101, first dummy patterns 102, and second dummy patterns 103. The main patterns 101 can be disposed on a substrate 100. The first dummy patterns 102 and the second dummy patterns 103 can be disposed around sides of the main pattern 101. The first dummy patterns 102 can be provided surrounding the second dummy patterns 103. That is, a first dummy pattern 102 is provided to surround a second dummy pattern 103. In one embodiment, the first dummy pattern 102 surrounds the second dummy pattern 103 in the layer below the second dummy pattern 103.

Here, the first dummy pattern can have a ring shape. In an embodiment, the first dummy pattern 102 can have four connected side regions and an open space within.

In one embodiment, the first dummy pattern 102 can be an active layer dummy pattern, and the second dummy pattern 103 can be a poly layer dummy pattern formed on the active layer dummy pattern.

Because the first dummy pattern 102 surrounds the second dummy pattern 103 in many embodiments of the present invention, the uniformity of the patterns can be improved.

According to an embodiment, since the first dummy pattern 102 surrounds the second dummy pattern 103, structures of the dummy patterns can be strong.

Because the uniformity of the dummy patterns can be secured, a critical diameter (CD) of each of the patterns is regular.

According to many embodiments, the first dummy pattern 102 provided surrounding the second dummy pattern 103 forms a set. Therefore, mask layout and fabrication processes can be simplified.

Hereinafter, a method for fabricating the semiconductor device according to an embodiment will be described with reference to FIGS. 1 and 2.

A main pattern 101 can be formed on a substrate 100. The main pattern 101 can include an active layer pattern, a poly pattern, a metal pattern, and/or a contact pattern. Although the main pattern 101 is shown as an active layer pattern in the first embodiment, implementations are not limited thereto.

A first dummy pattern 102 including an inner space region can be formed at a side of the main pattern 101. The formation of the main pattern 101 and the formation of the first dummy pattern 102 can be performed at different times using respectively different masks. In other implementations, the formation of the main pattern 101 and the first dummy pattern 102 can be performed at the same time using one mask.

The first dummy pattern 102 can have a ring shape with an open inner space therein. However, the shape of the first dummy pattern 102 is not limited to the ring shape. For example, the open region can be offset from the center of the first dummy pattern.

A second dummy pattern 103 can be formed such that the second dummy pattern 103 is disposed on the open inner space region of the first dummy pattern 102.

An interlayer dielectric can be formed on the substrate 100 including the second dummy pattern 103.

Although the first dummy pattern 102 has been described as an active layer dummy pattern, and the second dummy pattern 103 has been described as a poly dummy pattern, embodiments are not limited thereto.

FIGS. 3A to 3E provide schematic views of a mask layout method according to an embodiment.

Figure 3A:
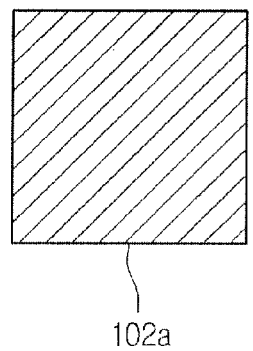
FIGS. 3A to 3E are schematic views for describing a mask layout method according to an embodiment.
Figure 3B:
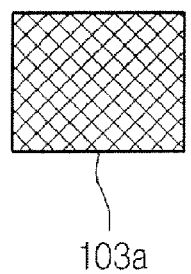
Figure 3C:
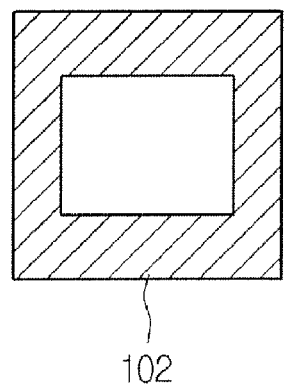

Referring to FIG. 3C, a first dummy pattern 102 including an inner space can be formed in a mask layout method according to an embodiment of the present invention To form the first dummy pattern 102 for a mask layout, a first parent dummy pattern 102a as illustrated in FIG. 3A can be created in a layout software tool.

Another first parent dummy pattern 102a can be shrunk to form a third dummy pattern 103a as illustrated in FIG. 3B.

Referring to FIG. 3C, the first parent dummy pattern 102a and the third dummy pattern 103a can be synthesized to remove a portion where the first parent dummy pattern 102a overlaps the third dummy pattern 103a, so that the first dummy pattern 102 is formed. Any available software tool for combining the patterns and removing a portion of the first parent dummy pattern 102a can be utilized.

The first dummy pattern 102 now includes an inner space therein.

Figure 3D:
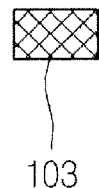

A second dummy pattern 103 can be formed as illustrated in FIG. 3D.

To form the second dummy pattern 103, the third dummy pattern 103a can be shrunk.

Accordingly, while dummy patterns formed on respectively different layers are designed, the third dummy pattern 103a used for forming the first dummy pattern 102 can be repeatedly used without requiring an additional dummy pattern design process. Therefore, mask layout processes can be simplified and accurate, and data burden can be reduced.

Figure 3E:
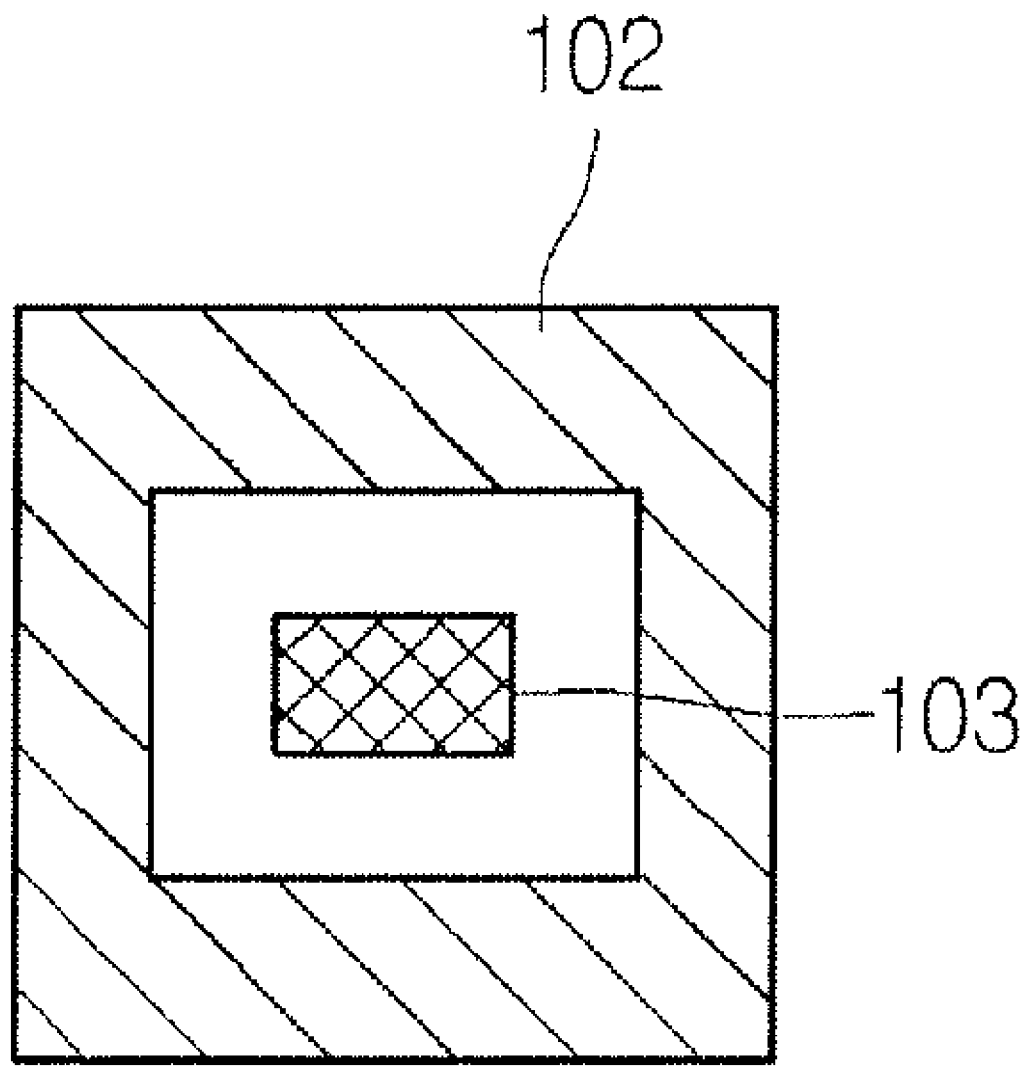

During design layout of the layers, the second dummy pattern 103 is disposed on the inner space of the first dummy pattern 102 as illustrated in FIG. 3E.

After the second dummy pattern 103 is disposed on the inner space of the first dummy pattern 102, the second dummy pattern 103 can be replaced with a dummy pattern having a type different from that of the first dummy pattern 102.

For example, the first dummy pattern 102 can be an active dummy pattern, and the second dummy pattern 103 can be a poly dummy pattern. Therefore, an active layer type pattern originally created for the second dummy pattern 102 when a third dummy pattern 103 was shrunk can be replaced with a selection of a poly type pattern after the shrunken third dummy pattern is placed on the inner space of the first dummy pattern 102.

In an alternative embodiment, the second dummy pattern 103 can be replaced with a dummy pattern having a type different from that of the first dummy pattern 102 before the second dummy pattern 103 is disposed in the inner space of the first dummy pattern 102.

According to embodiments of the present invention, since the first dummy pattern 102 surrounds the second dummy patterns 103, the uniformity of the patterns can be much improved.

In addition, the first dummy pattern 102 surrounding the second dummy pattern 103 can form a set. Accordingly, the data burden of designing the dummy pattern can be minimized.

Furthermore, since the first dummy pattern 102 surrounds the second dummy patterns 103 to form the set, the mask layout process can be simplified.

According to embodiments, because the first dummy pattern 102 surrounds the second dummy pattern 103, structures of the dummy patterns can be strong.

According to an embodiment, since the uniformity of the dummy patterns is secured, a CD of each of the patterns can be regular.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mask layout method, comprising:
    forming a first dummy pattern including an open space therein; and
    forming a second dummy pattern in the open space of the first dummy pattern, wherein forming the second dummy pattern comprises:
    shrinking a third parent dummy pattern; and
    disposing the shrunken third parent dummy pattern in the open space of the first dummy pattern.

2. The mask layout method according to claim 1, wherein the forming of the first dummy pattern comprises:
    forming a first parent dummy pattern;
    shrinking a second parent dummy pattern to form a third dummy pattern; and
    synthesizing the third dummy pattern and the first parent dummy pattern to remove a portion in which the first parent dummy pattern overlaps the third dummy pattern, thereby forming the first dummy pattern.

3. The mask layout method according to claim 1, wherein shrinking the third parent dummy pattern comprises shrinking the third parent dummy pattern to form another third dummy pattern and then shrinking the another third dummy pattern to form the second dummy pattern.

4. The mask layout method according to claim 1, further comprising replacing the shrunken third parent dummy pattern with a pattern type different from that of the first dummy pattern.

5. The mask layout method according to claim 4, wherein the replacing of the shrunken third parent dummy pattern with the pattern type different from that of the first dummy pattern is performed after the disposing of the shrunken third parent dummy pattern in the open space of the first dummy pattern.

6. The mask layout method according to claim 4, wherein the replacing of the shrunken third parent dummy pattern with the pattern type different from that of the first dummy pattern is performed before the disposing of the shrunken third parent dummy pattern in the open space of the first dummy pattern.

7. The mask layout method according to claim 4, wherein the pattern type of the first dummy pattern is an active layer type dummy pattern, and the pattern type of the second dummy pattern is a poly type dummy pattern.

8. The mask layout method according to claim 1, wherein the first dummy pattern has a ring shape.

* * * * *